US012581912B2

(12) United States Patent (10) Patent No.: US 12,581,912 B2
Kinpara et al. (45) Date of Patent: Mar. 17, 2026

(54) ELECTROSTATIC CHUCK DEVICE

(71) Applicant: SUMITOMO OSAKA CEMENT CO., LTD., Tokyo (JP)

(72) Inventors: Yuki Kinpara, Tokyo (JP); Taku Ichiyoshi, Tokyo (JP); Satoyoshi Inui, Tokyo (JP); Toru Sugamata, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 202 days.

(21) Appl. No.: 18/365,514

(22) Filed: Aug. 4, 2023

(65) Prior Publication Data

US 2024/0075575 A1 Mar. 7, 2024

(30) Foreign Application Priority Data

Sep. 6, 2022 (JP) ................................. 2022-141282

(51) Int. Cl.
    *H01L 21/687* (2006.01)
    *H01L 21/67* (2006.01)
    *H01L 21/683* (2006.01)
(52) U.S. Cl.
    CPC .. *H01L 21/68785* (2013.01); *H01L 21/67103* (2013.01); *H01L 21/6833* (2013.01)
(58) Field of Classification Search
    CPC ......... H01L 21/67103; H01L 21/67109; H01L 21/68785; H01L 21/6833
    See application file for complete search history.

(56) References Cited

U.S. PATENT DOCUMENTS

2020/0312684 A1* 10/2020 Mine ................. H01L 21/67109
2023/0122013 A1* 4/2023 Inoue .................. H01L 21/6875
                                                                361/234
2023/0146815 A1* 5/2023 Inoue ................... H01L 21/6831
                                                                156/345.53

FOREIGN PATENT DOCUMENTS

JP      2007-035878 A      2/2007
JP        2018056331 A  *  4/2018   ............... H05B 3/22
KR      20050000853 A  *  1/2005
KR      20210045827 A  *  4/2021   ....... H01L 21/67017

* cited by examiner

*Primary Examiner* — Sunil K Singh
*Assistant Examiner* — Michael Vitale
(74) *Attorney, Agent, or Firm* — Merchant & Gould P.C.

(57) ABSTRACT

An electrostatic chuck device comprising: a plate-shaped electrostatic chuck part which has an electrostatic adsorption electrode provided therein and has a mounting surface on which a plate-shaped sample is mounted; and a base part which supports the electrostatic chuck part on a support surface thereof from an opposite side of the mounting surface, wherein the base part has a disk shape which has a central axis at a center thereof, and a coolant channel extending along the support surface is provided inside the base part, wherein the coolant channel includes an outer peripheral channel which overlaps an outer edge of the plate-shaped sample when viewed from an axial direction of the central axis, and an inner peripheral channel which is disposed on an inner side in a radical direction than the outer peripheral channel, wherein at least a portion of the inner peripheral channel extends spirally around the central axis, and a channel cross-sectional area of the inner peripheral channel decreases as a distance from the central axis increases.

17 Claims, 3 Drawing Sheets

ELECTROSTATIC CHUCK DEVICE

BACKGROUND OF THE INVENTION

Field of the Invention

The present invention relates to an electrostatic chuck device.

Description of Related Art

In semiconductor manufacturing apparatuses using plasma, such as plasma etching apparatuses and plasma CVD apparatuses, an electrostatic chuck device is used as a device for easily attaching and fixing a wafer to a mounting surface and maintaining the wafer at a desired temperature. A structure having a plate-shaped ceramic body including a mounting surface and a base member provided with a cooling passage for flowing a cooling medium therein has been known.

SUMMARY OF THE INVENTION

In recent years, devices using semiconductors tend to be highly integrated. Therefore, when manufacturing devices, wiring microfabrication technology and three-dimensional mounting technology are required. In carrying out such a processing technique, the semiconductor manufacturing apparatus is required to reduce the in-plane temperature distribution of wafer (temperature difference). In the related art, the in-plane temperature distribution of the wafer may not be reduced to the desired temperature difference, and an improvement has been desired.

It is an object of the present invention to provide an electrostatic chuck device with high temperature uniformity.

That is, the present invention includes the following device shown in [1] to [6].

It is also preferable to combine two or more of the following characteristics as necessary.

[1] An electrostatic chuck device comprising:
a plate-shaped electrostatic chuck part which has an electrostatic adsorption electrode provided therein and has a mounting surface on which a plate-shaped sample is mounted; and
a base part which supports the electrostatic chuck part on a support surface thereof from an opposite side of the mounting surface,
wherein
the base part has a disk shape which has a central axis at a center thereof, and
a coolant channel extending along the support surface is provided inside the base part, wherein
the coolant channel includes
an outer peripheral channel which overlaps an outer edge of the plate-shaped sample when viewed from an axial direction of the central axis, and
an inner peripheral channel which is disposed on an inner side in a radical direction than the outer peripheral channel, wherein
at least a portion of the inner peripheral channel extends spirally around the central axis, and
a channel cross-sectional area of the inner peripheral channel decreases as a distance from the central axis increases.

[2] The electrostatic chuck device according to [1], in which a width dimension of the inner peripheral channel decreases as the distance from the central axis increases.

[3] The electrostatic chuck device according to [2], in which
the inner peripheral channel is continuously separated from the central axis while increasing a radius of curvature thereof along a circumferential direction of the base part, and the width dimension of the inner peripheral channel continuously decreases as tending to outward in the radial direction.

[4] The electrostatic chuck device according to [2], in which
the inner peripheral channel has a plurality of arc portions extending in an arc and disposed concentrically around the central axis, and among the plurality of arc portions, a width dimension of an arc portion which is positioned on an outer side in the radical direction is smaller than a width dimension of an arc portion which is positioned on an inner side in the radical direction.

[5] The electrostatic chuck device according to any one of [1] to [4], in which
a channel cross-sectional area of the outer peripheral channel is larger than a channel cross-sectional area of the inner peripheral channel.

[6] An electrostatic chuck device comprising:
a plate-shaped electrostatic chuck part which has an electrostatic adsorption electrode provided therein and has a mounting surface on which a plate-shaped sample is mounted; and
a base part which supports the electrostatic chuck part on a support surface thereof from an opposite side of the mounting surface,
wherein
the base part has a disk shape which has a central axis at a center thereof,
a coolant channel extending along the support surface is provided inside the base part,
the base part has a wall portion which partitions the coolant channel in a radial direction to form a spiral shape which is centered on the central axis, and
a radial dimension of the wall portion decreases as a distance from the central axis increases.

[7] The electrostatic chuck device according to [6], in which
the wall portion is continuously separated from the central axis while increasing a radius of curvature thereof along a circumferential direction of the base part, and the radial dimension of the wall portion continuously decreases as tending to outward in the radial direction.

[8] The electrostatic chuck device according to [6], in which
the wall portion has a plurality of arc walls extending in an arc and disposed concentrically around the central axis, and among the plurality of arc walls, a width dimension of an arc wall which is positioned on an outer side in the radical direction is smaller than a width dimension of an arc wall which is positioned on an inner side in the radical direction.

According to the present invention, it is possible to provide an electrostatic chuck device with high temperature uniformity.

DETAILED DESCRIPTION OF THE INVENTION

Preferable examples of an electrostatic chuck device according to the present embodiment will be described below with reference to the drawings. In addition, in all the drawings below, the dimensions and ratios of the constituent elements are appropriately changed in order to make the drawings easier to see. The following description is a description for better understanding of the gist of the invention, and does not limit the present invention unless otherwise specified. The number, length, width, quantity, position, size, numerical value, ratio, order, material, type, and the like can be changed, omitted, or added within a scope which does not depart from the present invention.

In the present specification, "the degree of in-plane temperature distribution (temperature difference) of the electrostatic chuck part (or mounting surface)" may be referred to as "temperature uniformity". The term "high temperature uniformity" means that the in-plane temperature distribution of the area of the mounting surface of the electrostatic chuck part on which the plate-shaped sample is mounted is small.

First Embodiment

Figure 1:
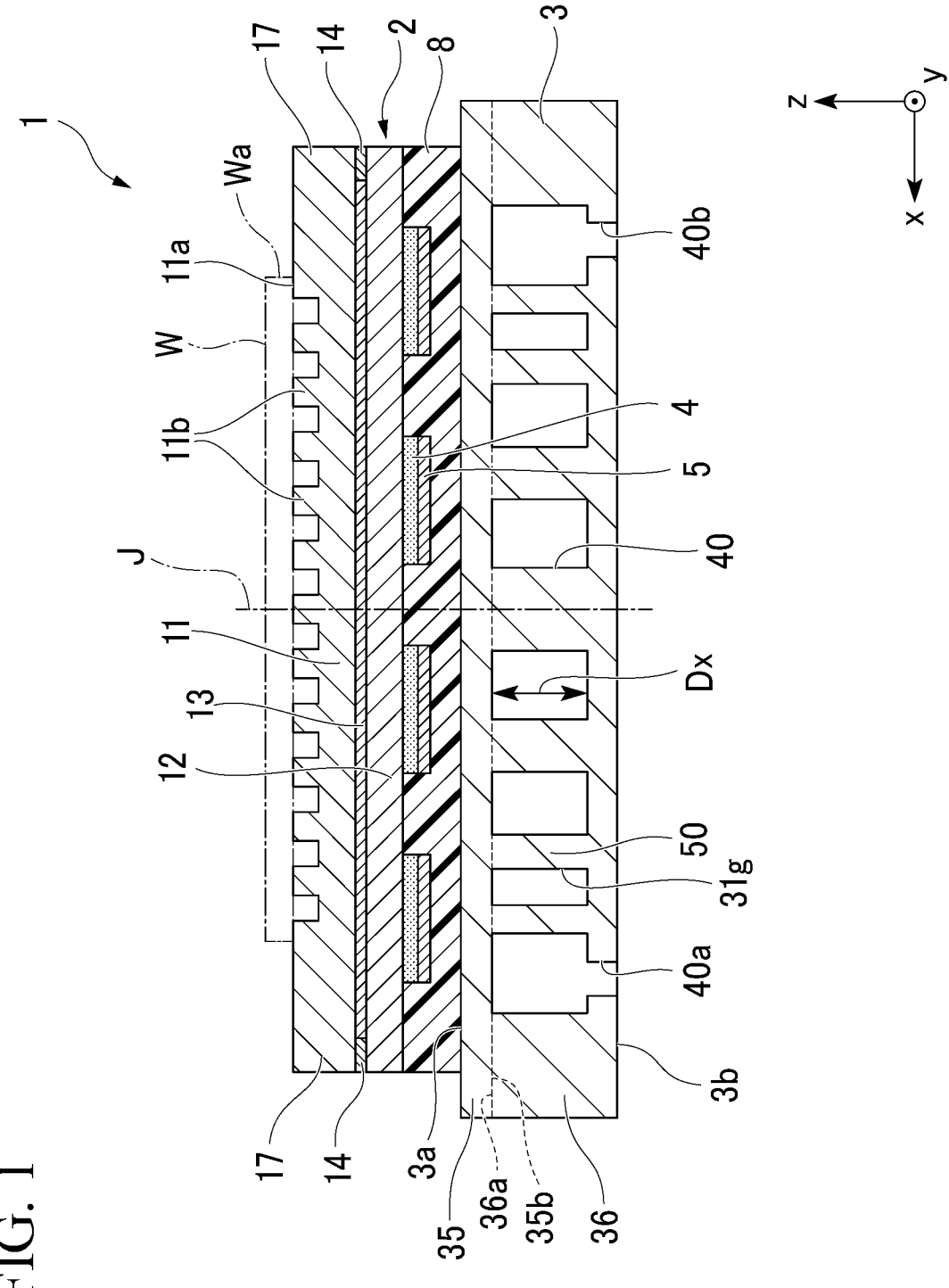
FIG. 1 is a cross-sectional view showing a preferable example of an electrostatic chuck device according to a first embodiment.

FIG. 1 is a cross-sectional view showing a preferable example of an electrostatic chuck device 1 according to a first embodiment. The electrostatic chuck device 1 has a plate-shaped electrostatic chuck part 2, a heater element 5, and a disk-shaped base part 3. The electrostatic chuck device 1 has a disk shape centered on the central axis J. The electrostatic chuck part 2, the heater element 5, and the base part 3 are laminated in this order along the axial direction of the central axis J.

In the following description, the direction of each portion of the electrostatic chuck device 1 will be described with the central axis J as the center. In the following description, the axial direction of the central axis J may be simply referred to as the "axial direction", the radial direction about the central axis J may be simply referred to as the "radial direction," and the circumferential direction about the central axis J may be simply referred to as the "circumferential direction". Further, in the following description, the vertical direction of each portion is defined by a posture in which the direction in which the central axis J extends coincides with the vertical direction. However, the posture during use of the electrostatic chuck device 1 is not limited.

Electrostatic Chuck Part

The electrostatic chuck part 2 includes a mounting plate 11 of which upper surface is a mounting surface 11a for mounting a circular plate-shaped sample W such as a semiconductor wafer, a supporting plate 12 that is integrated with the mounting plate 11 and supports the bottom portion side of the mounting plate 11, an electrostatic adsorption electrode 13 provided between the mounting plate 11 and the supporting plate 12, and an insulating material layer 14 that insulates the periphery of the electrostatic adsorption electrode 13. That is, the electrostatic chuck part 2 has a mounting surface 11a on which the plate-shaped sample W is mounted and has an electrostatic adsorption electrode 13 provided therein.

The mounting plate 11 and the supporting plate 12 are disk-shaped members having the same overlapping surface shape. The mounting plate 11 and the supporting plate 12 are made of a ceramic sintered body having mechanical strength and durability against corrosive gas and its plasma. The mounting plate 11 and the supporting plate 12 will be described later in detail.

A plurality of protrusions 11b having a diameter smaller than the thickness of the plate-shaped sample are formed at predetermined intervals on the mounting surface 11a of the mounting plate 11, and these protrusions 11b support the plate-shaped sample W.

A peripheral edge wall 17 is formed along the peripheral edge of the mounting surface 11a. The peripheral edge wall 17 is formed at the same height as the protrusion 11b, and supports the plate-shaped sample W together with the protrusions 11b.

The electrostatic adsorption electrode 13 is used as an electrostatic chuck electrode for generating electric charge and fixing the plate-shaped sample W by electrostatic adsorption force. The shape and size of the electrostatic adsorption electrode 13 are appropriately adjusted according to its use.

The electrostatic adsorption electrode 13 can be made of any material. For example, the electrostatic adsorption electrode 13 is preferably made of conductive ceramics such as aluminum oxide-tantalum carbide ($Al_2O_3$—$Ta_4C_5$) conductive composite sintered body, aluminum oxide-tungsten ($Al_2O_3$—W) conductive composite sintered body, aluminum oxide-silicon carbide ($Al_2O_3$—SiC) conductive composite sintered body, aluminum nitride-tungsten (AlN—W) conductive composite sintered body, aluminum nitride-tantalum (AlN—Ta) conductive composite sintered body, and yttrium oxide-molybdenum ($Y_2O_3$—Mo) conductive composite sintered body, or refractory metals such as tungsten (W), tantalum (Ta) and molybdenum (Mo).

The electrostatic adsorption electrode 13 can be easily formed by a film forming method such as a sputtering method or a vapor deposition method, or a coating method such as a screen printing method.

The insulating material layer 14 surrounds the electrostatic adsorption electrode 13 to protect the electrostatic adsorption electrode 13 from the corrosive gas and its plasma. Further, the insulating material layer 14 joins and integrates the boundary portion between the mounting plate 11 and the supporting plate 12, that is, the outer peripheral region other than the electrostatic adsorption electrode 13. The insulating material layer 14 is made of an insulating material having the same composition or the same main component as the material forming the mounting plate 11 and the supporting plate 12.

Heater Element

The heater element 5 heats the electrostatic chuck part 2. The heater element 5 is disposed on the lower surface side of the electrostatic chuck part 2. Any structure and material of the heater element 5 can be selected. For example, a non-magnetic metal thin plate having a certain thickness of 0.2 mm or less, preferably about 0.1 mm, such as a titanium (Ti) thin plate, a tungsten (W) thin plate, and a molybdenum (Mo) thin plate, is processed by photolithography or laser processing into a desired heater shape, for example, a shape in which a strip-shaped conductive thin plate is meandered, a shape in which the overall outline is an annular shape, or the like.

The heater element 5 may be provided by processing and molding the surface of the electrostatic chuck part 2 after bonding a non-magnetic metal thin plate to the electrostatic chuck part 2. The heater element 5 which is separately processed and molded at a position different from the electrostatic chuck part 2 may be provided on the surface of the electrostatic chuck part 2 by transfer printing.

The heater element 5 is adhered and fixed to the bottom surface of the supporting plate 12 with a sheet-like or film-like adhesive 4 made of silicone resin, acrylic resin, or the like having uniform thickness and heat resistance and insulating properties.

The electrostatic chuck part 2 and the base part 3 are adhered via an adhesive layer 8 provided between the electrostatic chuck part 2 and the base part 3. The adhesive layer 8 is formed of, for example, a hardened body obtained by heating and hardening a silicone-based resin composition or an acrylic resin. The adhesive layer 8 is preferably formed by, for example, placing a resin composition having flowability between the electrostatic chuck part 2 and the base part 3 and then heating and hardening the resin composition. Thus, the unevenness between the electrostatic chuck part 2 and the base part 3 is filled with the adhesive layer 8, and voids and defects are less likely to occur in the adhesive layer 8. Therefore, the thermal conductivity of the adhesive layer 8 can be made uniform in the plane, and the temperature uniformity of the electrostatic chuck part 2 can be improved.

Base Part

The base part 3 cools the electrostatic chuck part 2. The base part 3 is disk-shaped centered on the central axis J. The base part 3 has a support surface 3a that supports the electrostatic chuck part 2, and a bottom surface 3b that faces the opposite side of the support surface 3a. The electrostatic chuck part 2 supports the electrostatic chuck part 2 on the support surface 3a from the opposite side of the mounting surface 11a.

The material for forming the base part 3 is not particularly limited as long as it is a metal having excellent thermal conductivity, electrical conductivity, and workability, or a compound material containing these metals. For example, aluminum (Al), aluminum alloys, copper (Cu), titanium (Ti), copper alloys, stainless steel (SUS), and the like are preferably used. At least the surface of the base part 3 exposed to plasma is preferably subjected to anodizing, or an insulating film such as alumina is preferably formed thereon.

A coolant channel 40 through which coolant flows is provided inside the base part 3. The coolant channel 40 is provided with an inflow port 40a for drawing the coolant into the coolant channel 40 from the outside of the base part 3, and an outflow port 40b for discharging the coolant in the coolant channel 40 to the outside of the base part 3. The inflow port 40a and the outflow port 40b are opened in the bottom surface 3b of the base part 3. In FIG. 1, the radial positions of the inflow port 40a and the outflow port 40b are schematically illustrated, and do not represent the actual arrangement.

The coolant channel 40 extends along the support surface 3a. That is, the coolant channel 40 extends along a plane perpendicular to the central axis J. The coolant channel 40 has a rectangular channel cross section over the entire length. In the coolant channel 40 of the present embodiment, the axial dimension Dx of the coolant channel 40 is uniform over the entire length of the coolant channel 40. The coolant channel 40 has an upper member 35 and a lower member 36. The upper member 35 is a plate-shaped member whose thickness direction is the axial direction. Further, the lower member 36 is a plate-shaped member having a greater thickness dimension in the axial direction than the upper member 35.

The upper surface of the lower member 36 is provided with a concave groove 31g that opens upward. A portion of the lower member 36 between the concave grooves 31g configures a wall portion 50. That is, the base part 3 has a wall portion 50. The wall portion 50 partitions the concave grooves 31g.

The opening of the concave groove 31g is covered with the upper member 35. The coolant flows into the area surrounded by the inner surface of the concave groove 31g and the upper member 35. That is, the coolant channel 40 is configured in a region surrounded by the inner surface of the concave groove 31g and the lower surface of the upper member 35. Further, the wall portion 50 radially partitions the coolant channel 40. The lower surface 35b of the upper member 35 and the upper surface 36a of the lower member 36 are joined together by joining means such as brazing.

Figure 2:
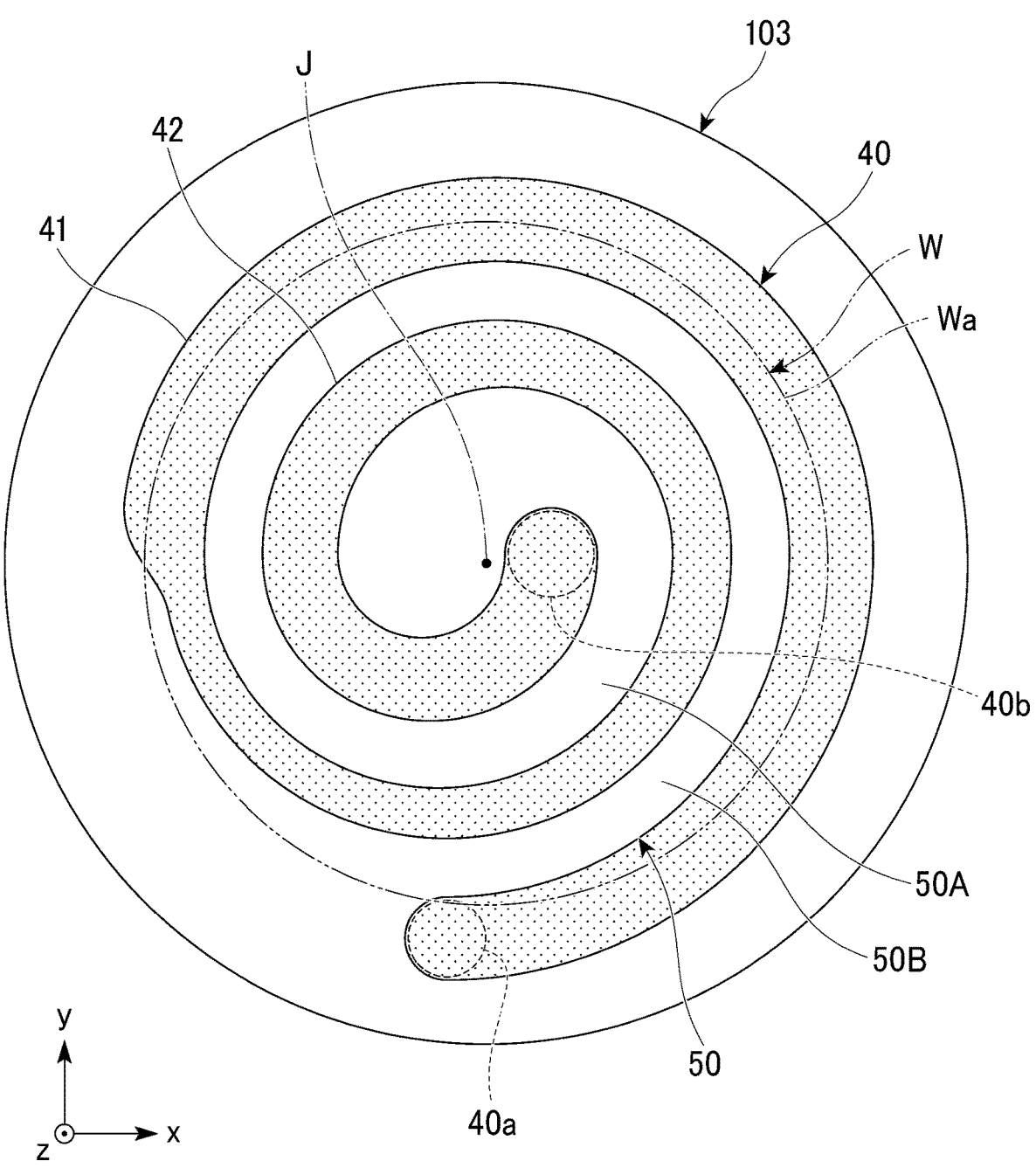
FIG. 2 is a schematic diagram showing a preferable example of a coolant channel according to the first embodiment.

FIG. 2 is a schematic diagram of the coolant channel 40 of the present embodiment. The coolant channel 40 of the present embodiment has a spiral shape spreading radially outward with respect to the central axis J. The coolant channel 40 of the present embodiment is continuous over the entire length. In the present embodiment, the coolant channel 40 is continuously separated from the central axis J while increasing the radius of curvature along the circumferential direction. A wall portion 50 is positioned between the radially overlapping portions of the coolant channel 40. The wall portion 50 defines the coolant channel 40 in a spiral shape centered on the central axis J.

The coolant channel 40 has an outer peripheral channel 41 and an inner peripheral channel 42. The outer peripheral channel 41 is positioned in the outermost peripheral region of the entire length of the coolant channel 40, and is a region that extends around the central axis J in the circumferential direction by one circumference or less. On the other hand, the inner peripheral channel 42 is disposed radially inward of the outer peripheral channel 41 in the entire length of the coolant channel 40. The outer peripheral channel 41 and the inner peripheral channel 42 are connected to each other. In the present embodiment, the inflow port 40a is provided in the outer peripheral channel 41, and the outflow port 40b is provided in the inner peripheral channel 42. Therefore, the coolant of the present embodiment flows through the coolant channel 40 in the order of the outer peripheral channel 41 and the inner peripheral channel 42.

The outer peripheral channel 41 is disposed on the outermost periphery of the coolant channel 40. The outer peripheral channel 41 extends in an arc about ¾ of a circumference around the central axis J. The inflow port 40a is provided at one end of the outer peripheral channel 41. The other end of the outer peripheral channel 41 is connected to the inner peripheral channel 42. The outer peripheral channel 41 overlaps the outer edge Wa of the plate-shaped sample W when viewed from the axial direction.

The width dimension of the outer peripheral channel 41 is uniform over the entire length. The coolant channel 40 of the present embodiment has a rectangular channel cross section over the entire length and a uniform axial dimension. Therefore, the outer peripheral channel 41 has a uniform channel cross-sectional area over the entire length.

The inner peripheral channel 42 has a spiral shape extending around the central axis J by turning about one and a half rounds. One end of the inner peripheral channel 42 is connected to the outer peripheral channel 41. The outflow port 40b is provided at the other end of the inner peripheral channel 42.

The width dimension of the inner peripheral channel 42 continuously decreases radially outward. Therefore, the inner peripheral channel 42 has a channel cross-sectional area that continuously decreases radially outward. The wall portion 50 has a spiral shape extending around the central axis J by turning one circumference and about ¾ of one circumference. In the present embodiment, the wall portion 50 is continuously separated from the central axis J while increasing the radius of curvature along the circumferential direction. The wall portion 50 is positioned between and defines the inner peripheral channels 42 in a region 50A on the inner peripheral side. Further, the wall portion 50 is positioned between and defines the outer peripheral channel 41 and the inner peripheral channel 42 in a region 50B on the outer peripheral side.

The radial dimension of the wall portion 50 continuously decreases as the distance from the central axis J increases. Therefore, in the coolant channel 40, the radial distance between the radially overlapping portions continuously decreases as the distance from the central axis J increases.

Other Configurations

The electrostatic chuck device 1 may have a gas supply hole (not shown) axially penetrating the electrostatic chuck part 2 and a lift pin insertion hole. The gas supply hole and the lift pin insertion hole are opened on the mounting surface 11a. A cooling gas such as He is supplied to the gas supply hole. The cooling gas introduced from the gas introduction hole flows through the gap between the mounting surface 11a and the lower surface of the plate-shaped sample W and between the plurality of protrusions 11b, thereby cooling the plate-shaped sample W. A lift pin (not shown) that supports the plate-shaped sample W and moves the plate-shaped sample W up and down is inserted into the lift pin insertion hole.

Action and Effect of First Embodiment

The outer peripheral channel 41 of the present embodiment overlaps the outer edge Wa of the plate-shaped sample W when viewed from the axial direction of the central axis J. Further, the inner peripheral channel 42 of the present embodiment is disposed radially inward of the outer peripheral channel 41. The base part 3 maintains the temperature of the plate-shaped sample W constant by actively cooling the region of the electrostatic chuck part 2 that overlaps with the plate-shaped sample W when viewed from the axial direction. According to the present embodiment, the inner peripheral channel 42 is disposed inside the outer edge Wa of the plate-shaped sample when viewed from the axial direction, and cools the region of the electrostatic chuck part 2 overlapping the plate-shaped sample W when viewed from the axial direction. On the other hand, the outer peripheral channel 41 cools the electrostatic chuck part 2 at the boundary portion between the inner region and the outer region of the outer edge Wa of the plate-shaped sample W when viewed from the axial direction. According to the present embodiment, the inner peripheral channel 42 and the outer peripheral channel 41 are provided, and by optimizing the respective channel configurations, the temperature uniformity of the electrostatic chuck part 2 can be improved up to the vicinity of the outer edge Wa of the plate-shaped sample W.

In the present embodiment, at least a portion of the inner peripheral channel 42 extends spirally around the central axis J. Further, the channel cross-sectional area of the inner peripheral channel 42 decreases as the distance from the central axis J increases. The flow velocity of the coolant in the channel increases as the channel cross-sectional area of the channel decreases, and accordingly, the collision frequency between the coolant molecules and the inner surface of the channel increases, and heat transfer becomes active. On the other hand, in the spiral inner peripheral channel 42, the closer it is to the central axis J, the smaller the radius of curvature becomes, so the pressure loss increases, and accordingly the heat transfer between the coolant and the inner surface of the channel becomes active. According to the present embodiment, the decrease in cooling capacity accompanying the increase in the radius of curvature of the inner peripheral channel 42 away from the central axis J can be offset by the increase in cooling capacity accompanying the decrease in the channel cross-sectional area. Thereby, the difference in cooling capacity between the area close to the central axis J and the area away from the central axis J can be decreased. That is, according to the present embodiment, since the channel cross-sectional area of the inner peripheral channel 42 is decreased radially outward, the cooling capacity of the base part 3 in the region away from the central axis J is improved and the temperature uniformity of the mounting surface 11a of the electrostatic chuck part 2 can be improved.

The width dimension of the inner peripheral channel 42 of the present embodiment decreases as the distance from the central axis J increases. That is, according to the present embodiment, the channel cross-sectional area of the inner peripheral channel 42 is changed by changing the dimension in the width direction. Therefore, the inner peripheral channel 42 of the present embodiment can have a rectangular cross-sectional shape and a uniform dimension along the axial direction of the inner peripheral channel 42. According to the present embodiment, the coolant channel 40 can be manufactured by processing the concave groove 31g (see FIG. 1) with a uniform depth Dx using a tool such as an end mill, and the manufacturing process of the base part 3 can be simplified.

The inner peripheral channel 42 of the present embodiment is continuously separated from the central axis J while increasing a radius of curvature along a circumferential direction, and the width dimension continuously decreases radially outward. According to the present embodiment, the inner peripheral channel 42 can be densely and uniformly disposed by forming the inner peripheral channel 42 in a spiral shape in which the radius of curvature is continuously increased along the circumferential direction. Thereby, the electrostatic chuck part 2 can be uniformly cooled by the base part 3, and the temperature uniformity of the mounting surface 11a of the electrostatic chuck part 2 can be improved. In addition, the width dimension of the inner peripheral channel 42 of the present embodiment is continuously decreased as the radius of curvature is continuously increased. As a result, the cooling capacity of the inner peripheral channel 42 can be continuously changed, the occurrence of singularity in the cooling capacity can be suppressed, and the temperature uniformity of the mounting surface 11a of the electrostatic chuck part 2 can be improved.

The channel cross-sectional area of the outer peripheral channel 41 of the present embodiment is larger than the channel cross-sectional area of the inner peripheral channel 42. Therefore, the width dimension of the outer peripheral channel 41 is larger than the width dimension of the inner peripheral channel 42. Since the outer peripheral channel 41 overlaps the outer edge Wa of the plate-shaped sample W when viewed from the axial direction, the plate-shaped sample W is not placed directly above the outer edge Wa in the radially outer portion. Therefore, the outer peripheral channel 41 can sufficiently cool the electrostatic chuck part 2 immediately above even if the channel cross-sectional area is increased in the portion radially outside the outer edge Wa.

In the base part 3 of the present embodiment, the radial dimension of the wall portion 50 decreases as the distance from the central axis J increases. As the radial dimension of the wall portion 50 decreases, the distance between the coolant channels 40 arranged in the radial direction via the wall portion 50 becomes closer. That is, as the radial dimension of the wall portion 50 decreases, the density of the coolant channel 40 increases, and the cooling capacity of the region increases. According to the present embodiment, by reducing the radial dimension of the wall portion 50 on the radial outer side, it is possible to improve the cooling capacity of the region away from the central axis J, and improve the temperature uniformity of the mounting surface 11a of the electrostatic chuck part 2.

Particularly in the present embodiment, the wall portion 50 is continuously separated from the central axis J while increasing the radius of curvature along the circumferential direction, and the radial dimension is continuously decreased toward radially outward. As a result, the cooling capacity of the inner peripheral channel 42 can be continuously changed radially outward, and the temperature uniformity of the mounting surface 11a of the electrostatic chuck part 2 can be improved.

In the present embodiment, the inflow port 40a is provided at the radially outer end portion of the coolant channel 40, and the outflow port 40b is provided at the radially inner end portion of the coolant channel 40. Therefore, the coolant in the coolant channel 40 spirally flows from the radially outer end toward the radially inner end. As described above, the cooling capacity of the coolant channel 40 needs to be improved in the region spaced apart from the central axis J and having a large radius of curvature. According to the present embodiment, the temperature uniformity of the electrostatic chuck part 2 can be improved by allowing the coolant with a low temperature to pass through the radially outer region where the need for cooling is high.

Second Embodiment

Figure 3:
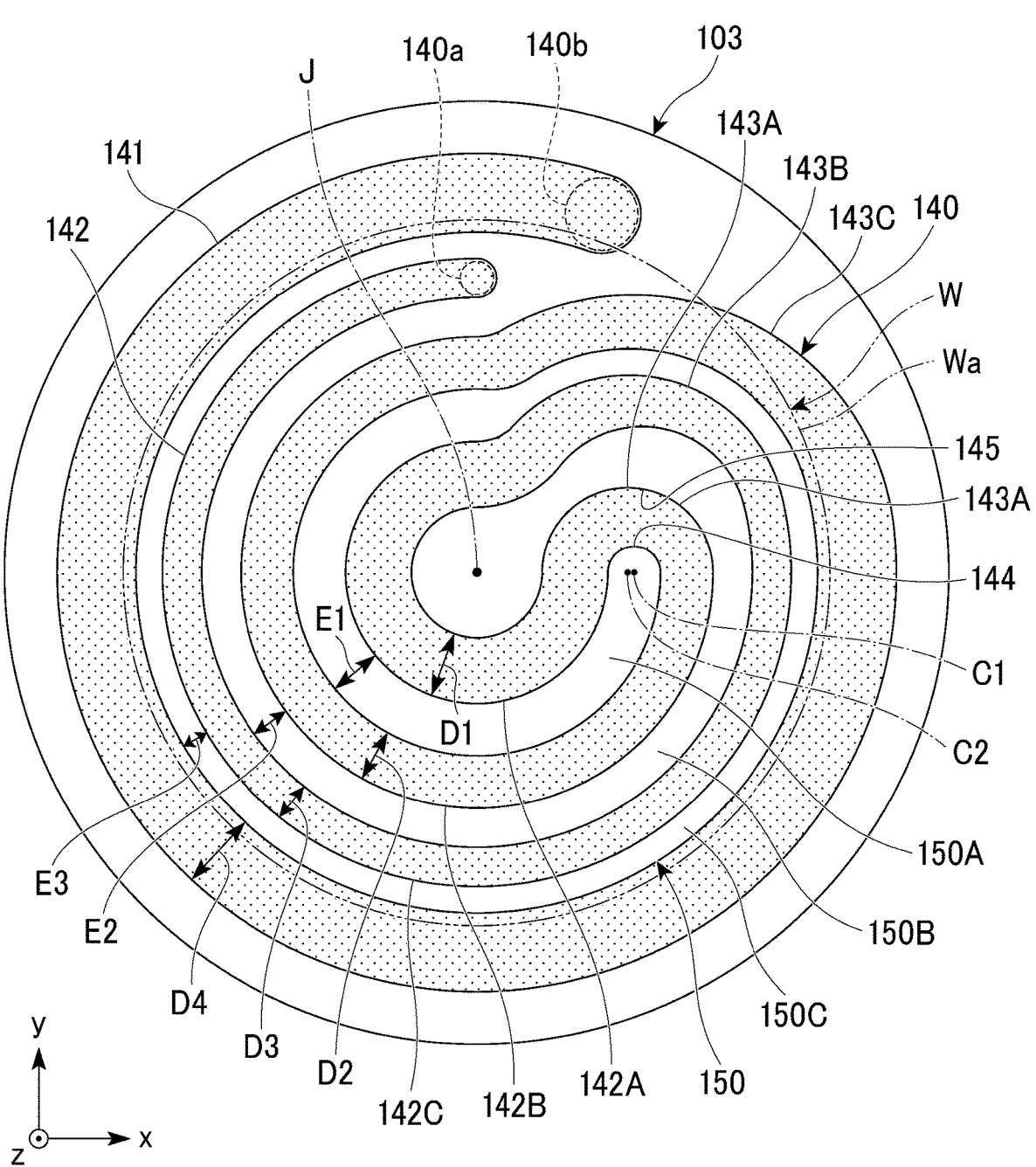
FIG. 3 is a schematic diagram showing a preferable example of a coolant channel according to a second embodiment.

FIG. 3 is a schematic diagram of the coolant channel 140 of the second embodiment. The coolant channel 140 of the second embodiment will be described below with reference to FIG. 3. In addition, components similar to those of the above-described embodiment are denoted by the same reference numerals, and detailed description thereof is omitted.

The coolant channel 140 of the present embodiment has a double spiral shape that is folded near the central axis J. The double spiral of the coolant channel 140 spreads radially outward with respect to the central axis J. The coolant channel 140 of the present embodiment is continuous over the entire length. The coolant channel 140 of the present embodiment has a rectangular channel cross section over the entire length and a uniform axial dimension. The wall portion 150 is positioned between the radially overlapping portions of the coolant channel 140. The wall portion 150 defines the coolant channel 140 in a spiral shape centered on the central axis J.

The coolant channel 140 has an outer peripheral channel 141, and an inner peripheral channel 142 disposed radially inward of the outer peripheral channel 141. The outer peripheral channel 141 and the inner peripheral channel 142 are connected to each other. In the present embodiment, the inflow port 140a is provided in the inner peripheral channel 142, and the outflow port 140b is provided in the outer peripheral channel 141. Therefore, the coolant of the present embodiment flows through the coolant channel 40 in the order of the inner peripheral channel 142 and the outer peripheral channel 141.

The outer peripheral channel 141 is disposed on the outermost periphery of the coolant channel 140. The outer peripheral channel 141 extends in an arc about ¾ of a circumference around the central axis J. The inner peripheral channel 142 is connected to one end of the outer peripheral channel 141. The outflow port 140b is provided at the other end of the outer peripheral channel 141. In addition, the outer peripheral channel 141 overlaps the outer edge Wa of the plate-shaped sample W when viewed from the axial direction. The width dimension of the outer peripheral channel 141 is uniform over the entire length. Therefore, the outer peripheral channel 141 has a uniform channel cross-sectional area over the entire length.

The inner peripheral channel 142 has a first arc portion 142A, a second arc portion 142B, a third arc portion 142C, a first connecting portion 143A, a second connecting portion 143B, and a third connecting portion 143C. The first arc portion 142A, the second arc portion 142B, and the third arc portion 142C extend in an arc around the central axis J. The first arc portion 142A, the second arc portion 142B, and the third arc portion 142C are disposed concentrically around the central axis J.

The first arc portion 142A is positioned at the innermost periphery of the inner peripheral channel 142. The first arc portion 142A extends in an arc about ¾ of a circumference around the central axis J. The first connecting portion 143A is connected to one end of the first arc portion 142A. The second connecting portion 143B is connected to the other end of the first arc portion 142A. The width dimension of the first arc portion 142A is uniform over the entire length. Therefore, the first arc portion 142A has a uniform channel cross-sectional area over the entire length.

The second arc portion 142B is positioned radially outside the first arc portion 142A. The second arc portion 142B is positioned between the first arc portion 142A and the third arc portion 142C in the radial direction. The second arc portion 142B extends in an arc about ¾ of a circumference around the central axis J. The first connecting portion 143A is connected to one end of the second arc portion 142B. The third connecting portion 143C is connected to the other end of the second arc portion 142B. The width dimension of the second arc portion 142B is uniform over the entire length. Therefore, the second arc portion 142B has a uniform channel cross-sectional area over the entire length.

The third arc portion 142C is positioned radially outward of the second arc portion 142B. The third arc portion 142C is positioned between the second arc portion 142B and the outer peripheral channel 141 in the radial direction. The third arc portion 142C extends in an arc about ¾ of a circumference around the central axis J. The second connecting portion 143B is connected to one end of the third arc portion 142C. The inflow port 140a is provided at the other end of the third arc portion 142C. The width dimension of the third arc portion 142C is uniform over the entire length. Therefore, the third arc portion 142C has a uniform channel cross-sectional area over the entire length.

The width dimension D2 of the second arc portion 142B is smaller than the width dimension D1 of the first arc portion 142A (D2<D1). Further, the width dimension D3 of the third arc portion 142C is smaller than the width dimension D2 of the second arc portion 142B (D3<D2). That is, among the plurality of arc portions 142A, 142B, and 142C, the arc portion positioned radially outside the other arc portions has a smaller radial dimension than the other arc portions (D3<D2<D1). Furthermore, the width dimension D4 of the outer peripheral channel 141 is larger than the width dimension of the inner peripheral channel 142 at any position (D4>D1, D4>D2, D4>D3). That is, the width dimension D4 of the outer peripheral channel 141 is larger than the width dimensions D1, D2, and D3 of the inner peripheral channel 142.

The first connecting portion 143A connects one end of the first arc portion 142A and one end of the second arc portion 142B. In the present embodiment, one end of the first arc portion 142A and one end of the second arc portion 142B are arranged side by side in the radial direction. The first connecting portion 143A connects the first arc portion 142A and the second arc portion 142B so as to be folded back like a hairpin. The width dimension of the first connecting portion 143A gradually decreases from the end portion on the first arc portion 142A side toward the end portion on the second arc portion 142B side.

The first connecting portion 143A has an inner corner surface 144 and an outer corner surface 145 facing each other. The inner corner surface 144 is a semicircular arc surface centered on the center point C1. In addition, the outer corner surface 145 is a semicircular arc surface centered on the center point C2. The radius of curvature of inner corner surface 144 is less than the radius of curvature of outer corner surface 145. Further, the center point C1 of the inner corner surface 144 and the center point C2 of the outer corner surface 145 are disposed at different positions. That is, the inner corner surface 144 and the outer corner surface 145 are arc surfaces having different centers. Thus, the first connecting portion 143A smoothly connects the first arc portion 142A and the second arc portion 142B having different width dimensions.

The second connecting portion 143B connects the other end of the first arc portion 142A and one end of the third arc portion 142C. The second connecting portion 143B connects the first arc portion 142A and the third arc portion 142C so as to be folded back like a hairpin. The second connecting portion 143B extends along the first connecting portion 143A with a larger radius of curvature than the first connecting portion 143A. The width dimension of the second connecting portion 143B gradually decreases from the end portion on the first arc portion 142A side toward the end portion on the third arc portion 142C side. The second connecting portion 143B has an inner corner surface and an outer corner surface similar to those of the first connecting portion 143A, thereby smoothly connecting the first arc portion 142A and the third arc portion 142C.

The third connecting portion 143C connects the other end of the second arc portion 142B, and the one end of the outer peripheral channel 141. The third connecting portion 143C connects the second arc portion 142B and the outer peripheral channel 141 so as to be folded back like a hairpin. The third connecting portion 143C extends along the second connecting portion 143B with a larger radius of curvature than the second connecting portion 143B. The third connecting portion 143C gradually increases in width dimension from the end portion on the second arc portion 142B side toward the end portion on the outer peripheral channel 141 side. The third connecting portion 143C has an inner corner surface and an outer corner surface similar to those of the first connecting portion 143A, thereby smoothly connecting the second arc portion 142B and the outer peripheral channel 141.

The wall portion 150 has a first arc wall 150A, a second arc wall 150B, and a third arc wall 150C. The first arc wall 150A, the second arc wall 150B, and the third arc wall 150C extend in an arc around the central axis J. Further, the first arc wall 150A, the second arc wall 150B, and the third arc wall 150C are disposed concentrically around the central axis J.

The first arc wall 150A extends in an arc about ¾ of a circumference around the central axis J. The first arc wall 150A is positioned radially between and defines the first arc portion 142A and the second arc portion 142B. The radial dimension of the first arc wall 150A is uniform over the entire length.

The second arc wall 150B extends in an arc about ¾ of a circumference around the central axis J. The second arc wall 150B is positioned radially between and defines the second arc portion 142B and the third arc portion 142C. The radial dimension of the second arc wall 150B is uniform over the entire length.

The third arc wall 150C extends in an arc about ¾ of a circumference around the central axis J. The third arc wall 150C is positioned between and defines the third arc portion 142C and the outer peripheral channel 141 in the radial direction. The radial dimension of the third arc wall 150C is uniform over the entire length.

The radial dimension E2 of the second arc wall 150B is smaller than the radial dimension E1 of the first arc wall 150A (E2<E1). Further, the radial dimension E3 of the third arc wall 150C is smaller than the radial dimension E2 of the second arc wall 150B (E3<E2). That is, among the plurality of arc walls 150A, 150B, and 150C, the arc wall positioned radially outside the other arc walls has a smaller radial dimension than the other arc walls (E3<E2 <E1).

Action and Effect of Second Embodiment

According to the base part 103 of the present embodiment, as in the above-described embodiment, the channel cross-sectional area of the inner peripheral channel 142 decreases as the distance from the central axis J increases, so that the cooling capacity in the area distant from the central axis J is improved, and the temperature uniformity of the mounting surface 11a of the electrostatic chuck part 2 can be improved. Further, according to the base part 103 of the present embodiment, the channel cross-sectional area of the outer peripheral channel 141 is smaller than the channel cross-sectional area of the inner peripheral channel 142, as in the above-described embodiments. Thereby, the electrostatic chuck part 2 can be sufficiently cooled.

The inner peripheral channel 142 of the present embodiment has a plurality of arc portions 142A, 142B, and 142C that extend in an arc and disposed concentrically around the central axis J. Among the plurality of arc portions 142A, 142B, and 142C, the arc portion positioned radially outward is smaller in the width dimension than the arc portion positioned radially inward. According to the present embodiment, since the plurality of arc portions 142A, 142B, and 142C are arranged concentrically, it is easy to dispose the plurality of arc portions 142A, 142B, and 142C densely, and the base part 103 can facilitate uniform cooling of the electrostatic chuck part 2. Further, by setting the width dimensions D1, D2, and D3 of the arc portions 142A, 142B, and 142C to the above-described relationship (D1>D2>D3), the cooling capacity of the region distant from the central axis J is increased, and the temperature uniformity of the electrostatic chuck part 2 can be improved. In addition, when the width directions of the plurality of arc portions 142A, 142B, 142C are made uniform along the circumferential direction, the manufacturing process of the arc portions 142A, 142B, 142C can be simplified.

In the base part 103 of the present embodiment, the wall portion 150 has a plurality of arc walls 150A, 150B, and 150C extending in an arc and disposed concentrically around the central axis J, and among the plurality of arc walls 150A, 150B, and 150C, the arc wall positioned radially outside the other arc walls has a smaller radial dimension than the other arc walls. According to the present embodiment, since the plurality of arc walls 150A, 150B, and 150C are arranged concentrically, it is easy to dispose the arc walls 150A, 150B, and 150C densely, and the base part 103 can facilitate uniform cooling of the electrostatic chuck part 2. Further, by setting the radial dimensions E1, E2, and E3 of the arc portions 142A, 142B, and 142C to the above-described relationship (E1 >E2 >E3), the cooling capacity of the region distant from the central axis J is improved, and the temperature uniformity of the electrostatic chuck part 2 can be improved.

In the present embodiment, one of the inflow port 140a and the outflow port 140b is positioned on the outermost periphery of the inner peripheral channel 142 and the other is positioned on the outer peripheral channel 141. In other words, the inflow port 140a and the outflow port 140b are both disposed to be biased toward the outer peripheral side of the coolant channel 140. Thus, the inflow port 140a and the outflow port 140b are not disposed in the vicinity of the central axis J of the base part 103, and other components such as through holes are likely to be disposed in the vicinity of the central axis J. Further, the temperature of the coolant in the coolant channel 140 gradually rises as the coolant flows from the inflow port 140a to the outflow port 140b. According to the present embodiment, by disposing both the inflow port 140a and the outflow port 140b biased to one side in the radial direction, it is possible to suppress the occurrence of a temperature gradient inside and outside the electrostatic chuck part 2 in the radial direction due to the temperature rise of the coolant, and the temperature uniformity of the electrostatic chuck part 2 can be improved.

Although the preferred embodiments according to the present invention have been described above with reference to the accompanying drawings, the present invention is not limited to such examples. The various shapes, combinations, and the like of the constituent members shown in the above examples are merely examples, and various modifications can be made based on design requirements and the like without departing from the gist of the present invention.

For example, in each of the above-described embodiments, a case in which the cross-section of the coolant channel is rectangular and the axial dimension is uniform over the entire length has been described, but the cross-section of the coolant channel is not limited to the above-described embodiments. For example, the coolant channel may vary in the channel cross-sectional area by varying the axial dimension.

What is claimed is:

1. An electrostatic chuck device comprising:
   a plate-shaped electrostatic chuck part which has an electrostatic adsorption electrode provided therein and has a mounting surface on which a plate-shaped sample is mounted; and a base part which supports the electrostatic chuck part on a support surface thereof from an opposite side of the mounting surface,
   wherein the base part has a disk shape which has a central axis at a center thereof, and a coolant channel extending along the support surface is provided inside the base part,
   wherein the coolant channel includes: an outer peripheral channel which overlaps an outer edge of the plate-shaped sample when viewed from an axial direction of the central axis; and an inner peripheral channel which is disposed on a radially inner side of the outer peripheral channel, the inner peripheral channel being located closer to the central axis than the outer peripheral channel is, and a first end of the inner peripheral channel connects with a first end of the outer peripheral channel,
   wherein at least a portion of the inner peripheral channel extends spirally around the central axis,
   wherein a channel cross-sectional area of the inner peripheral channel decreases as a distance from the central axis increases,
   wherein a channel cross-sectional area of the outer peripheral channel is larger than the channel cross-sectional area of the inner peripheral channel,
   wherein the inner peripheral channel has: a first arc portion which is positioned at an innermost periphery of the inner peripheral channel; a second arc portion which is positioned radially outside the first arc portion; and a third arc portion which is positioned between the second arc portion and the outer peripheral channel in the radial direction,
   wherein the first arc portion, the second arc portion, and the third arc portion are each disposed concentrically around the central axis and each respectively extends in an arc,
   wherein a radial dimension of the outer peripheral channel is larger than a radial dimension of the inner peripheral channel,
   wherein a radial dimension of the second arc portion is smaller than a radial dimension of the first arc portion, and
   wherein a radial dimension of the third arc portion is smaller than the radial dimension of the second arc portion.

2. The electrostatic chuck device according to claim 1, wherein
   a width dimension of the inner peripheral channel decreases as the distance from the central axis increases.

3. The electrostatic chuck device according to claim 1, wherein
   the outer peripheral channel overlaps the outer edge of the plate-shaped sample over an entire length of the outer peripheral channel, when viewed from the axial direction of the central axis, and
   an arc wall is positioned between the first arc portion, the second arc portion, and the third arc portion.

4. The electrostatic chuck device according to claim 1, wherein
   the coolant channel has a rectangular channel cross section and a uniform axial dimension over an entire length thereof,
   an inflow port, which is configured to draw a coolant into the coolant channel from an outside of the base part, is provided at a second end of the inner peripheral channel,

an outflow port, which is configured to discharge the coolant to the outside of the base part, is provided at a second end of the outer peripheral channel, and the inflow port and the outflow port are opened in a bottom surface of the base part.

5. The electrostatic chuck device according to claim 1, wherein the inner peripheral channel has a double spiral shape, which is folded around the central axis and is continuous over an entire length of the inner peripheral channel.

6. The electrostatic chuck device according to claim 1, wherein the outer peripheral channel is positioned in an outermost peripheral region of the coolant channel, the outer peripheral channel extends in an arc about ¾ of a circumference around the central axis, and a width dimension of the outer peripheral channel is uniform over the entire length thereof.

7. The electrostatic chuck device according to claim 1, wherein the first arc portion, the second arc portion, and the third arc portion respectively extend in an arc about ¾ of a circumference around the central axis.

8. The electrostatic chuck device according to claim 1, wherein the inner peripheral channel includes:

a first connecting portion, which connects the first arc portion and the second arc portion, a second connecting portion, which connects the first arc portion and the third arc portion, and a third connecting portion, which connects the second arc portion and the outer peripheral channel.

9. The electrostatic chuck device according to claim 8, wherein the first connecting portion, the second connecting portion, and the third connecting portion each have a hairpin shape.

10. The electrostatic chuck device according to claim 1, wherein a second end of the inner peripheral channel is positioned at an outermost periphery of the inner peripheral channel.

11. The electrostatic chuck device according to claim 1, wherein a second end of the outer peripheral channel is located at a position which overlaps the outer edge of the plate-shaped sample, when viewed from the axial direction of the central axis.

12. An electrostatic chuck device comprising:

a plate-shaped electrostatic chuck part which has an electrostatic adsorption electrode provided therein and has a mounting surface on which a plate-shaped sample is mounted; and a base part which supports the electrostatic chuck part on a support surface thereof from an opposite side of the mounting surface, wherein the base part has a disk shape which has a central axis at a center thereof, and a coolant channel extending along the support surface is provided inside the base part, wherein the base part has a wall portion which partitions the coolant channel in a radial direction to form a spiral shape which is centered on the central axis, and a radial dimension of the wall portion decreases as a distance from the central axis increases, wherein the wall portion has: a first arc wall; a second arc wall; and a third arc wall,

wherein the first arc wall, the second arc wall, and the third arc wall each respectively extends in an arc around the central axis, and each is disposed concentrically around the central axis, wherein the first arc wall has a uniform radial dimension over an entire length of the first arc wall, wherein the second arc wall has a uniform radial dimension over an entire length of the second arc wall, wherein the third arc wall has a uniform radial dimension over an entire length of the third arc wall, wherein the coolant channel includes: an inner peripheral channel; and an outer peripheral channel, wherein the inner peripheral channel has: a first arc portion which is positioned at an innermost periphery of the inner peripheral channel; a second arc portion which is positioned radially outside the first arc portion; and a third arc portion which is positioned between the second arc portion and the outer peripheral channel in the radial direction, wherein the first arc portion, the second arc portion, and the third arc portion are each disposed concentrically around the central axis and each respectively extends in an arc, wherein the first arc wall is positioned radially between the first arc portion and the second arc portion, wherein the second arc wall is positioned radially between the second arc portion and the third arc portion, wherein the third arc wall is positioned radially between the third arc portion and the outer peripheral channel, wherein the radial dimension of the second arc wall is smaller than the radial dimension of the first arc wall, and wherein the radial dimension of the third arc wall is smaller than the radial dimension of the second arc wall.

13. The electrostatic chuck device according to claim 12, wherein the first arc wall, the second arc wall, and the third arc wall extend respectively in an arc about ¾ of a circumference around the central axis.

14. An electrostatic chuck device comprising:

a plate-shaped electrostatic chuck part which has an electrostatic adsorption electrode provided therein and has a mounting surface on which a plate-shaped sample is mounted; and a base part which supports the electrostatic chuck part on a support surface thereof from an opposite side of the mounting surface, wherein the base part has a disk shape which has a central axis at a center thereof, and a coolant channel extending along the support surface is provided inside the base part, wherein the coolant channel includes: an outer peripheral channel which overlaps an outer edge of the plate-shaped sample when viewed from an axial direction of the central axis; and an inner peripheral channel which is disposed on an radially inner side of the outer peripheral channel, the inner peripheral channel being located closer to the central axis than the outer peripheral channel is, and a first end of the inner peripheral channel connects with a first end of the outer peripheral channel, wherein at least a portion of the inner peripheral channel extends spirally around the central axis, wherein a channel cross-sectional area of the inner peripheral channel decreases as a distance from the central axis increases, wherein the inner peripheral channel has: a first arc portion which is positioned at an innermost periphery of the inner peripheral channel; a second arc portion which is positioned radially outside the first arc portion; and a third arc portion which is positioned between the second arc portion and the outer peripheral channel in the radial direction, wherein the first arc portion, the second arc portion, and the third arc portion are each disposed concentrically around the central axis and each respectively extends in an arc, wherein a radial dimension of the outer peripheral channel is larger than a radial dimension of the inner peripheral channel, wherein a radial dimension of the second arc portion is smaller than a radial dimension of the first arc portion, wherein a radial dimension of the third arc portion is smaller than the radial dimension of the second arc portion, wherein a second end of the inner peripheral channel is positioned on an outermost periphery of the inner peripheral channel, and wherein a second end of the outer peripheral channel is located at a position which overlaps the outer edge of the plate-shaped sample, when viewed from the axial direction of the central axis.

15. The electrostatic chuck device according to claim 14, wherein the coolant channel has a rectangular channel cross section and a uniform axial dimension over an entire length thereof.

16. The electrostatic chuck device according to claim 14, wherein an inflow port, which is configured to draw a coolant into the coolant channel from an outside of the base part, is provided at the second end of the inner peripheral channel, an outflow port, which is configured to discharge the coolant to the outside of the base part, is provided at the second end of the outer peripheral channel, and the inflow port and the outflow port are opened in a bottom surface of the base part.

17. The electrostatic chuck device according to claim 14, wherein an inflow port, which is configured to draw a coolant into the coolant channel from an outside of the base part, is provided at the second end of the outer peripheral channel, an outflow port, which is configured to discharge the coolant to the outside of the base part, is provided at the second end of the inner peripheral channel, and the inflow port and the outflow port are opened in a bottom surface of the base part.

* * * * *